United States Patent
Lu (10) Patent No.: US 12,266,662 B2
(45) Date of Patent: Apr. 1, 2025

(54) ARRAY SUBSTRATE, MANUFACTURING METHOD THEREOF, AND DISPLAY PANEL

(71) Applicant: Shenzhen China Star Optoelectronics Semiconductor Display Technology Co., Ltd., Guangdong (CN)

(72) Inventor: Macai Lu, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 946 days.

(21) Appl. No.: 17/419,772

(22) PCT Filed: May 19, 2021

(86) PCT No.: PCT/CN2021/094586
§ 371 (c)(1),
(2) Date: Jun. 30, 2021

(87) PCT Pub. No.: WO2022/236856
PCT Pub. Date: Nov. 17, 2022

(65) Prior Publication Data
US 2022/0392926 A1  Dec. 8, 2022

(30) Foreign Application Priority Data
May 12, 2021 (CN) .......................... 202110518047.7

(51) Int. Cl.
*H01L 27/12* (2006.01)

(52) U.S. Cl.
CPC ........ *H01L 27/1244* (2013.01); *H01L 27/127* (2013.01)

(58) Field of Classification Search
None
See application file for complete search history.

(56) References Cited

U.S. PATENT DOCUMENTS

2016/0163810 A1    6/2016   Huang et al.
2016/0336461 A1*  11/2016   Wang .................. H01L 29/7869

FOREIGN PATENT DOCUMENTS

| CN | 101542715 A | 9/2009 |
|----|-------------|--------|
| CN | 101546077 A | 9/2009 |
| CN | 101939828 A | 1/2011 |
| CN | 103022150 A | 4/2013 |
| CN | 105023605 A | 11/2015 |
| CN | 106684103 A | 5/2017 |
| CN | 107710411 A | 2/2018 |

(Continued)

*Primary Examiner* — William C Trapanese
(74) *Attorney, Agent, or Firm* — Rivka Friedman (57) ABSTRACT

An array substrate, a manufacturing method thereof, and a display panel are provided. By disposing first electrodes and second electrodes on top and bottom sides of an active layer, respectively, and disposing a part of each gate electrode among sub-active patterns, the array substrate is formed with vertical-structured thin film transistors. Therefore, a channel resistance can be reduced, and a channel width of the thin film transistors can be reduced, thereby reducing an area of the thin film transistors, reducing impedance of the thin film transistors, and reducing power consumption of the display panel.

18 Claims, 5 Drawing Sheets

(56) References Cited

FOREIGN PATENT DOCUMENTS

| | | |
|---|---|---|
| CN | 110729360 A | 1/2020 |
| CN | 112420784 A | 2/2021 |
| CN | 112490254 A | 3/2021 |

\* cited by examiner

FIG. 7

ARRAY SUBSTRATE, MANUFACTURING METHOD THEREOF, AND DISPLAY PANEL

FIELD OF INVENTION

The present disclosure relates to the field of display technologies, and more particularly, to an array substrate, a manufacturing method thereof, and a display panel.

BACKGROUND OF INVENTION

Display devices are driven by thin film transistors. Current thin film transistors have a larger area, which causes resistances of the thin film transistors to be larger, thereby causing a greater voltage loss and higher power consumption in the display devices. Further, the display devices have a plurality of pixels, and each of the pixels has a plurality of the thin film transistors, thereby further increasing power consumption of the display devices.

Therefore, current display devices have a technical problem of larger impedance of the thin film transistors causing the display devices to have higher power consumption.

Technical problem: the embodiments of the present disclosure provide an array substrate, a manufacturing method thereof, and a display panel to solve the technical problem of larger impedance of the thin film transistors causing the display devices to have higher power consumption in current display devices.

SUMMARY OF INVENTION

To solve the above problems, an embodiment of the present disclosure provides following technical solutions.

An embodiment of the present disclosure provides an array substrate. The array substrate includes:
    a substrate;
    a first metal layer disposed on one side of the substrate and formed with a plurality of first electrodes;
    an active layer disposed on one side of the first metal layer away from the substrate and formed with a plurality of active patterns, wherein, each of the active patterns has a plurality of sub-active patterns; and
    a second metal layer disposed on one side of the active layer away from the first metal layer and formed with a plurality of second electrodes; wherein, the first electrodes are connected to the active layer, the second electrodes are connected to the active layer, and a projection of the first electrodes on the active layer and a projection of the second electrodes on the active layer have an overlapping portion; and the array substrate further includes a plurality of gate electrodes, each of the gate electrodes has a part disposed among the sub-active patterns, and the gate electrodes are insulated from the active layer.

In some embodiments, the second metal layer is formed with the second electrodes, at least one of the second electrodes includes a plurality of second sub-electrodes, the second sub-electrodes are connected to each other to form one of the second electrodes by connecting ends of the second sub-electrodes, and the second sub-electrodes are in contact with the sub-active patterns correspondingly by one to one.

In some embodiments, the array substrate further includes a gate insulating layer disposed on one side of the second metal layer away from the active layer, the gate insulating layer is filled between the second sub-electrodes, and the gate insulating layer is filled between the sub-active patterns.

In some embodiments, the array substrate further includes a gate electrode layer disposed on one side of the gate insulating layer away from the second metal layer, the gate electrode layer includes the gate electrodes, and the part of each of the gate electrodes is filled between the gate insulating layer.

In some embodiments, a projected area of the first electrodes on the substrate is greater than a projected area of the second electrodes on the substrate.

In some embodiments, the array substrate further includes:
    a passivation layer disposed on one side of the second metal layer away from the active layer and formed with through-holes; and
    a pixel electrode layer disposed on one side of the passivation layer away from the second metal layer;
    wherein, the pixel electrode layer penetrates through the through-holes to connect to the first electrodes.

In some embodiments, the array substrate further includes a gate electrode layer disposed on one side of the first metal layer away from the active layer.

In some embodiments, the first metal layer is formed with the first electrodes, at least one of the first electrodes includes a plurality of first sub-electrodes, and the first sub-electrodes are connected to each other to form one of the first electrodes by connecting ends of the first sub-electrodes.

In some embodiments, the first metal layer is formed with light-shielding patterns, and the light-shielding patterns are insulated from the first electrodes.

In some embodiments, a projected area of the second electrodes on the substrate is greater than a projected area of the first electrodes on the substrate.

At a same time, an embodiment of the present disclosure provides a manufacturing method of the array substrate. The method includes following steps:
    providing the substrate;
    disposing the first metal layer on the substrate and patterning the first metal layer to form the plurality of first electrodes;
    disposing the active layer on the first metal layer;
    disposing the second metal layer on the active layer;
    disposing a photoresist on the second metal layer, etching the second metal layer to form the plurality of second electrodes, etching the active layer to form the plurality of active patterns, and stripping off the photoresist; wherein, each of the second electrodes includes the plurality of second sub-electrodes, each of the active patterns includes the plurality of sub-active patterns, and the projection of the first electrodes on the active layer coincides with the projection of the second electrodes on the active layer;
    disposing the gate insulating layer on the second metal layer; and
    disposing the gate electrode layer on the gate insulating layer and patterning the gate electrode layer to form the plurality of gate electrodes, wherein, each of the gate electrodes has the part disposed among the sub-active patterns, and the gate electrodes are insulated from the active layer.

At a same time, an embodiment of the present disclosure provides a display panel, which includes the array substrate. The array substrate includes:
    the substrate;
    the first metal layer disposed on the side of the substrate and formed with the plurality of first electrodes;
    the active layer disposed on the side of the first metal layer away from the substrate and formed with the plurality of active patterns, wherein, each of the active patterns has the plurality of sub-active patterns; and the second metal layer disposed on the side of the active layer away from the first metal layer and formed with the plurality of second electrodes; wherein, the first electrodes are connected to the active layer, the second electrodes are connected to the active layer, and the projection of the first electrodes on the active layer and the projection of the second electrodes on the active layer have the overlapping portion; and the array substrate further includes the plurality of gate electrodes, each of the gate electrodes has the part disposed among the sub-active patterns, and the gate electrodes are insulated from the active layer.

In some embodiments, the second metal layer is formed with the second electrodes, at least one of the second electrodes includes the plurality of second sub-electrodes, the second sub-electrodes are connected to each other to form one of the second electrodes by connecting ends of the second sub-electrodes, and the second sub-electrodes are in contact with the sub-active patterns correspondingly by one to one.

In some embodiments, the array substrate further includes the gate insulating layer disposed on the side of the second metal layer away from the active layer, the gate insulating layer is filled between the second sub-electrodes, and the gate insulating layer is filled between the sub-active patterns.

In some embodiments, the array substrate further includes the gate electrode layer disposed on the side of the gate insulating layer away from the second metal layer, the gate electrode layer includes the gate electrodes, and the part of each of the gate electrodes is filled between the gate insulating layer.

In some embodiments, the projected area of the first electrodes on the substrate is greater than the projected area of the second electrodes on the substrate.

In some embodiments, the array substrate further includes:

the passivation layer disposed on the side of the second metal layer away from the active layer and formed with the through-holes; and the pixel electrode layer disposed on the side of the passivation layer away from the second metal layer;

wherein, the pixel electrode layer penetrates through the through-holes to connect to the first electrodes.

In some embodiments, the array substrate further includes the gate electrode layer disposed on one side of the first metal layer away from the active layer.

In some embodiments, the first metal layer is formed with the first electrodes, at least one of the first electrodes includes the plurality of first sub-electrodes, and the first sub-electrodes are connected to each other to form one of the first electrodes by connecting ends of the first sub-electrodes.

In some embodiments, the first metal layer is formed with the light-shielding patterns, and the light-shielding patterns are insulated from the first electrodes.

Beneficial effect: the present disclosure provides the array substrate, the manufacturing method thereof, and the display panel. The array substrate includes the substrate, the first metal layer, the active layer, and the second metal layer. The first metal layer is disposed on the side of the substrate and is formed with the plurality of first electrodes. The active layer is disposed on the side of the first metal layer away from the substrate and is formed with the plurality of active patterns, wherein, each of the active patterns has the plurality of sub-active patterns. The second metal layer is disposed on the side of the active layer away from the first metal layer and is formed with the plurality of second electrodes. Wherein, the first electrodes are connected to the active layer, the second electrodes are connected to the active layer, and the projection of the first electrodes on the active layer and the projection of the second electrodes on the active layer have the overlapping portion. The array substrate further includes the plurality of gate electrodes, each of the gate electrodes has the part disposed among the sub-active patterns, and the gate electrodes are insulated from the active layer. By disposing the first electrodes and the second electrodes on top and bottom sides of the active layer, respectively, and disposing the part of each of the gate electrodes among the sub-active patterns, the array substrate is formed with vertical-structured thin film transistors. A channel length of the active layer, that is a thickness of the active layer, is much less than a channel length of a horizontal-structured active layer, so a channel resistance can be reduced; and since the first electrodes and the second electrodes have the overlapping portion in a vertical direction, a channel width of thin film transistors can be reduced, thereby reducing an area of the thin film transistors, reducing impedance of the thin film transistors, and reducing power consumption of the display panel.

DESCRIPTION OF DRAWINGS

The following detailed description of specific embodiments of the present disclosure will make the technical solutions and other beneficial effects of the present disclosure obvious with reference to the accompanying drawings.

DETAILED DESCRIPTION OF PREFERRED EMBODIMENTS

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure.

Current display devices have a technical problem of larger impedance of thin film transistors causing the display devices to have higher power consumption. The embodiments of the present disclosure provide an array substrate, a manufacturing method thereof, and a display panel to solve the above technical problem.

Figure 1:
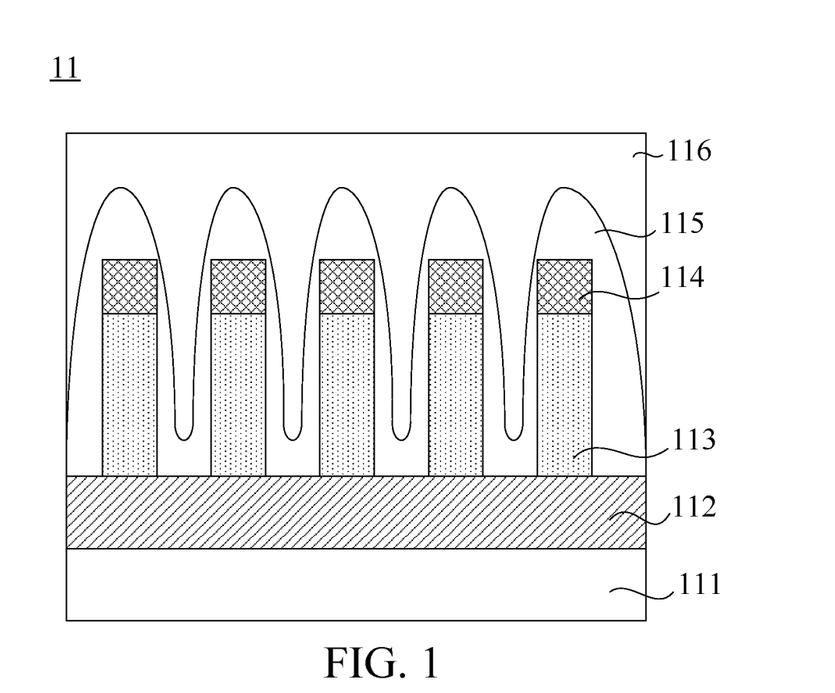
FIG. 1 is a first schematic structural diagram of an array substrate according to an embodiment of the present disclosure.

As shown in FIG. 1, an embodiment of the present disclosure provides the array substrate 11, which includes:

a substrate 111;

a first metal layer 112 disposed on one side of the substrate 111 and formed with a plurality of first electrodes;

an active layer 113 disposed on one side of the first metal layer 112 away from the substrate 111 and formed with a plurality of active patterns, and each of the active patterns has a plurality of sub-active patterns; and a second metal layer 114 disposed on one side of the active layer 113 away from the first metal layer 112 and formed with a plurality of second electrodes. Wherein, the first electrodes are connected to the active layer 113, the second electrodes are connected to the active layer 113, and a projection of the first electrodes on the active layer and a projection of the second electrodes on the active layer have an overlapping portion. The array substrate 11 further includes a plurality of gate electrodes 116, each of the gate electrodes 116 has a part disposed among the sub-active patterns, and the gate electrodes are insulated from the active layer.

This embodiment provides the array substrate. By disposing the first electrodes and the second electrodes on top and bottom sides of the active layer, respectively, and disposing the part of each of the gate electrodes among the sub-active patterns, the array substrate is formed with vertical-structured thin film transistors. A channel length of the active layer, that is a thickness of the active layer, is much less than a channel length of a horizontal-structured active layer, so a channel resistance can be reduced; and since the first electrodes and the second electrodes have the overlapping portion in a vertical direction, a channel width of thin film transistors can be reduced, thereby reducing an area of the thin film transistors, reducing impedance of the thin film transistors, and reducing power consumption of the display panel.

Specifically, as shown in FIG. 1, a channel length of the thin film transistors in the array substrate means a distance between the first electrodes and the second electrodes, that is the thickness of the active layer shown in FIG. 1. The thickness of the active layer is generally tens of nanometers, which is much less than a channel length (ranging from 4 µm to 10 µm) of horizontal-structured thin film transistors.

Figure 6:
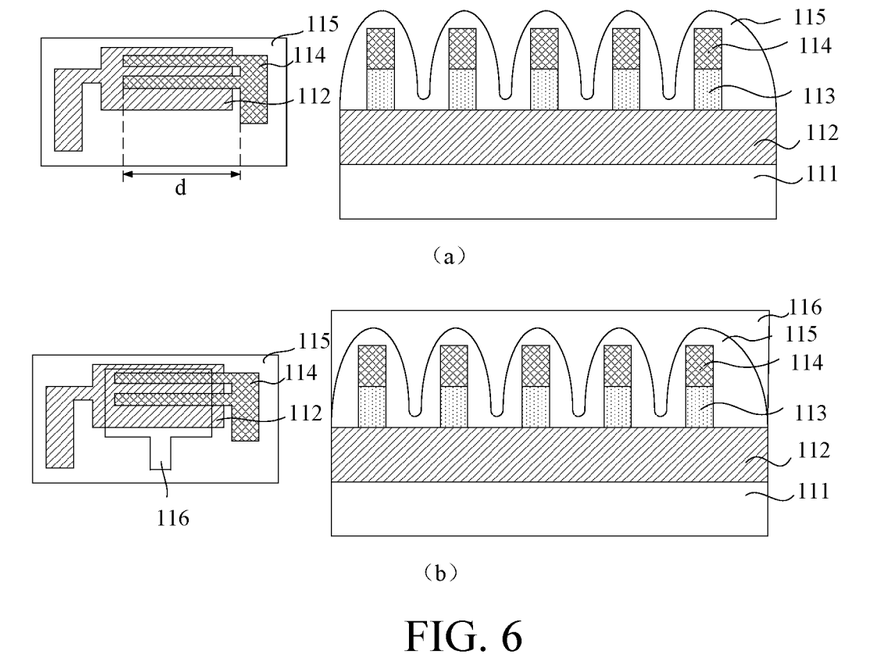
FIG. 6 is a third schematic structural diagram of the array substrate corresponding to each step of the manufacturing method of the array substrate according to an embodiment of the present disclosure.

Specifically, as shown in FIG. 6(a), the channel width of the thin film transistors in the array substrate means a spacing between the first electrodes 112 and the second electrodes 114 in a horizontal direction shown in a left picture in FIG. 6(a). For example, the channel width is "d" shown in the left picture in FIG. 6(a).

In this embodiment, since the projections of the first electrodes and the second electrodes have the overlapping portion, the channel width of the thin film transistors can be reduced, thereby reducing the area of the thin film transistors.

In an embodiment of the present disclosure, the channel width ranges from 5 µm to 10 µm but is not limited to this. In this embodiment, the projections of the first electrodes and the second electrodes have the overlapping portion, so the channel width of the thin film transistors is smaller than a channel width of the horizontal-structured thin film transistors. For example, the channel width is 5 µm, so the channel width of the thin film transistors is reduced, and the area of the thin film transistors is reduced.

It should be noted that since only one of the first electrodes in the first metal layer is shown in FIG. 1, the first electrodes in FIG. 1 are not specifically marked, and in FIG. 1, the one of the first electrodes is a part representing the first metal layer 112, that is, both the first electrodes and the first metal layer can be represented by the reference numeral 112. Correspondingly, in FIG. 1, one of the second electrodes is a part representing the second metal layer 114, that is, both the second electrodes and the second metal layer can be represented by the reference numeral 114. Correspondingly, in FIG. 1, one of the gate electrodes is a part representing the gate electrode layer 116, that is, both the gate electrodes and the gate electrode layer can be represented by the reference numeral 116.

In this embodiment, the active layer is formed with the active patterns, and each of the active patterns is formed with the sub-active patterns, so each of the gate electrodes has the part disposed among the sub-active patterns, thereby improving a control ability of the gate electrodes. In addition, each of the gate electrodes having the part disposed among the sub-active patterns can increase a thickness of the gate electrode layer, thereby reducing impedance of the gate electrode layer. Further, the gate electrode layer can planarize the thin film transistors, thereby facilitating formation of subsequent film layers.

In an embodiment, the second metal layer is formed with the second electrodes, at least one of the second electrodes includes a plurality of second sub-electrodes, the second sub-electrodes are connected to each other to form one of the second electrodes by connecting ends of the second sub-electrodes, and the second sub-electrodes are in contact with the sub-active patterns correspondingly by one to one. In each of the thin film transistors, the second sub-electrodes are allowed to be in contact with the sub-active patterns correspondingly by one to one by each of the active patterns being divided into the sub-active patterns and each of the second electrodes being divided into the second sub-electrodes correspondingly, thereby forming ohmic contact areas, and constituting the ohmic contact areas and channel areas of each of the thin film transistors correspondingly. In addition, the second sub-electrodes are connected to each other by the connecting ends, thereby realizing electrical connections of the second sub-electrodes. Therefore, signals of the second sub-electrodes constituting signals of the second electrodes can be ensured in signal input and output, thereby realizing drive or switch functions of a single thin film transistor.

In an embodiment, a projected area of the second sub-electrodes on the substrate is equal to a projected area of the sub-active patterns on the substrate. That is, the second electrodes can be prevented from being in contact with channels and affecting performances of the thin film transistors by correspondingly disposing the second sub-electrodes to the sub-active patterns.

This disposition is used to solve a problem of short circuits of the thin film transistors caused by the channel areas being prone to having metals due to each of the active patterns being divided into the sub-active patterns and each of the second electrodes being divided into a plurality of sub-electrodes. In an embodiment, as shown in FIG. 1, the array substrate 11 further includes a gate insulating layer 115 disposed on one side of the second metal layer 114 away from the active layer 113, the gate insulating layer 115 is filled between the second sub-electrodes, and the gate insulating layer 115 is filled between the sub-active patterns. The metals or active materials can be prevented from falling into the channel areas and causing short circuits of the thin film transistors by disposing the gate insulating layer among the sub-active patterns and among the second sub-electrodes. In addition, since the gate insulating layer is disposed among the sub-active patterns, there is no need to dispose an interlayer insulating layer, thereby reducing a thickness of the display panel.

In an embodiment, as shown in FIG. 1, the array substrate 11 further includes a gate electrode layer 116 disposed on one side of the gate insulating layer 115 away from the second metal layer 114, the gate electrode layer 116 includes the gate electrodes, and the part of each of the gate electrodes is filled between the gate insulating layer 115. When disposing the gate electrode layer, the thickness of the gate electrodes can be increased by allowing the gate electrodes to be filled in gaps among the gate insulating layer, thereby reducing impedance of the gate electrodes. Further, the gate electrode layer can planarize the thin film transistors, thereby facilitating the formation of the subsequent film layers.

In an embodiment, the array substrate further includes the gate electrode layer disposed on one side of the first metal layer away from the active layer. When disposing the gate electrode layer, the gate electrode layer may also be disposed under the first metal layer, and at this time, the gate insulating layer is disposed on the gate electrode layer to insulate the gate electrode layer from the first metal layer.

In an embodiment, a projected area of the first electrodes on the substrate is greater than a projected area of the second electrodes on the substrate. When disposing the second sub-electrodes and the sub-active patterns to reduce the channel length, each of the second electrodes may also be disposed as a whole without being formed with the sub-electrodes.

Figure 2:
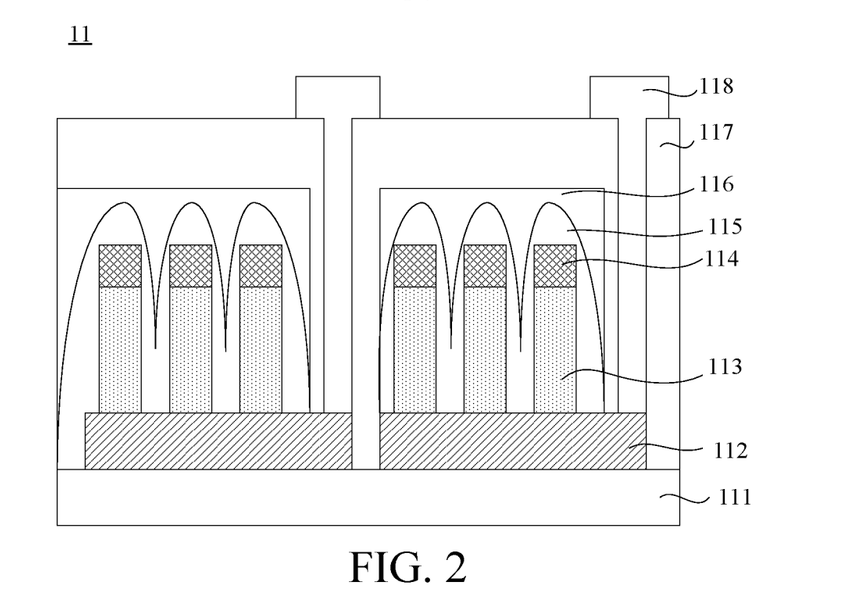
FIG. 2 is a second schematic structural diagram of the array substrate according to an embodiment of the present disclosure.

Since the first electrodes are disposed under the active layer, a pixel electrode layer needs to be connected to the first electrodes. In an embodiment of the present disclosure, as shown in FIG. 2, the array substrate 11 further includes:

a passivation layer 117 disposed on one side of the second metal layer 114 away from the active layer 113 and formed with through-holes; and a pixel electrode layer 118 disposed on one side of the passivation layer 117 away from the second metal layer 114.

Wherein, the pixel electrode layer 118 penetrates through the through-holes to connect to the first electrodes. When the first electrodes are disposed under the active layer, the pixel electrode layer cannot be directly connected to the first electrodes, so the first electrodes may be formed with connecting ends, and each of the film layers may be formed with the through-holes in an area corresponding to the connecting ends, thereby allowing the pixel electrode layer to penetrate through the through-holes to connect to the first electrodes.

Specifically, the pixel electrode layer is disposed on the passivation layer and penetrates through the through-holes of the passivation layer to connect to the first electrodes. In addition, regarding the second metal layer (second electrodes) and the active layer, when they are patterned, the connecting ends of the first electrodes can be disposed avoiding patterns of the second metal layer and the active layer, and therefore, the connecting ends of the first electrodes can be connected to the pixel electrode layer by the through-holes of the passivation layer. Regarding other film layers disposed on the second metal layer (second electrodes), the other film layers may also be defined with the through-holes correspondingly, thereby allowing the pixel electrode layer to penetrate through the through-holes of each film layer to connect to the first electrodes.

In an embodiment, a conductive material is disposed in the through-holes, and the conductive material is connected to the pixel electrode layer and the first electrodes. When the first electrodes are disposed under the active layer, a spacing between the first electrodes and the pixel electrode layer is larger, so a metal material may be disposed in the through-holes to conduct the first electrodes and pixel electrodes, thereby preventing the pixel electrodes from breaking due to an overly large drop of the pixel electrodes and causing the display panel to have abnormal display.

Specifically, the conductive material includes the metal material and indium tin oxide. A selection of the conductive material is based on better conductivity.

In an embodiment, the pixel electrode layer penetrates through the through-holes to connect to the second electrodes. When the pixel electrode layer is connected to the thin film transistors, the pixel electrode layer may also be connected to the second electrodes. Correspondingly, the pixel electrode layer may be connected to the connecting ends of the second electrodes to realize connections between the pixel electrode layer and the thin film transistors.

In an embodiment, the first metal layer is formed with the first electrodes, at least one of the first electrodes includes a plurality of first sub-electrodes, the first sub-electrodes are connected to each other to form one of the first electrodes by the connecting ends of the first sub-electrodes, and the first sub-electrodes are disposed corresponding to the sub-active patterns by one to one. When each of the active patterns is divided into the sub-active patterns, each of the first electrodes is divided into the first sub-electrodes correspondingly to allow the first sub-electrodes to be disposed corresponding to the sub-active patterns by one to one, thereby forming the ohmic contact areas and the channel areas. In addition, the first sub-electrodes are connected to each other by the connecting ends, thereby realizing electrical connections of the first sub-electrodes. Therefore, signals of the first sub-electrodes constituting signals of the first electrodes can be realized in signal input and output, thereby realizing the drive or switch functions of the single thin film transistor.

In an embodiment, the first metal layer is formed with light-shielding patterns, and the light-shielding patterns are insulated from the first electrodes. When disposing the first electrodes, the light-shielding patterns may also be disposed in a same layer as the first electrodes, thereby reducing the thickness of the display panel.

In an embodiment, the projected area of the second electrodes on the substrate is greater than the projected area of the first electrodes on the substrate.

In an embodiment, the array substrate further includes data lines disposed in the first metal layer. When disposing the data lines, the data lines may be disposed in the first metal layer, and corresponding data lines may be connected to a driving chip by another through-holes. This embodiment of the present disclosure is not limited to this, and the data lines may also be disposed in the second metal layer.

In an embodiment, the first electrodes are source electrodes and the second electrodes are drain electrodes; or the first electrodes are the drain electrodes and the second electrodes are the source electrodes. In the present disclosure, polarities of the first electrodes and the second electrodes are not limited and are based on the first electrodes and the second electrodes being the source electrodes or the drain electrodes. Correspondingly, disposition positions of the pixel electrode layer and wirings such as the data lines are determined according to the polarities of the first electrodes and the second electrodes.

In an embodiment, a material of the first metal layer includes molybdenum, a laminate of molybdenum/aluminum, a laminate of molybdenum/copper, a laminate of molybdenum-titanium alloy/copper, molybdenum-titanium alloy/copper/molybdenum-titanium alloy, a laminate of titanium/aluminum/titanium, a laminate of titanium/copper/titanium, a laminate of molybdenum/copper/indium zinc oxide, a laminate of indium zinc oxide/copper/indium zinc oxide, a laminate of molybdenum/copper/indium tin oxide, a laminate of nickel/copper/nickel, a laminate of molybdenum-titanium-nickel alloy/copper/molybdenum-titanium-nickel alloy, molybdenum-nickel alloy/copper/molybdenum-nickel alloy, nickel-chromium alloy/copper/nickel-chromium alloy, nickel-titanium alloy/copper/nickel-titanium alloy, titanium-chromium alloy/copper/titanium-chromium alloy, and copper-niobium alloy.

In an embodiment, a material of the active layer includes amorphous silicon, crystalline silicon, polysilicon, and oxides, wherein, the oxides include indium gallium zinc oxide.

In an embodiment, a material of the second metal layer includes molybdenum, the laminate of molybdenum/aluminum, the laminate of molybdenum/copper, the laminate of molybdenum-titanium alloy/copper, molybdenum-titanium alloy/copper/molybdenum-titanium alloy, the laminate of titanium/aluminum/titanium, the laminate of titanium/copper/titanium, the laminate of molybdenum/copper/indium zinc oxide, the laminate of indium zinc oxide/copper/indium zinc oxide, the laminate of molybdenum/copper/indium tin oxide, the laminate of nickel/copper/nickel, the laminate of molybdenum-titanium-nickel alloy/copper/molybdenum-titanium-nickel alloy, molybdenum-nickel alloy/copper/molybdenum-nickel alloy, nickel-chromium alloy/copper/nickel-chromium alloy, nickel-titanium alloy/copper/nickel-titanium alloy, titanium-chromium alloy/copper/titanium-chromium alloy, and copper-niobium alloy.

In an embodiment, a material of the gate insulating layer includes hafnium oxide, tantalum oxide, aluminum oxide, silicon nitride, and silicon oxide.

In an embodiment, a material of the gate electrode layer includes molybdenum, the laminate of molybdenum/aluminum, the laminate of molybdenum/copper, the laminate of molybdenum-titanium alloy/copper, molybdenum-titanium alloy/copper/molybdenum-titanium alloy, the laminate of titanium/aluminum/titanium, the laminate of titanium/copper/titanium, the laminate of molybdenum/copper/indium zinc oxide, the laminate of indium zinc oxide/copper/indium zinc oxide, the laminate of molybdenum/copper/indium tin oxide, the laminate of nickel/copper/nickel, the laminate of molybdenum-titanium-nickel alloy/copper/molybdenum-titanium-nickel alloy, molybdenum-nickel alloy/copper/molybdenum-nickel alloy, nickel-chromium alloy/copper/nickel-chromium alloy, nickel-titanium alloy/copper/nickel-titanium alloy, titanium-chromium alloy/copper/titanium-chromium alloy, and copper-niobium alloy.

Figure 3:
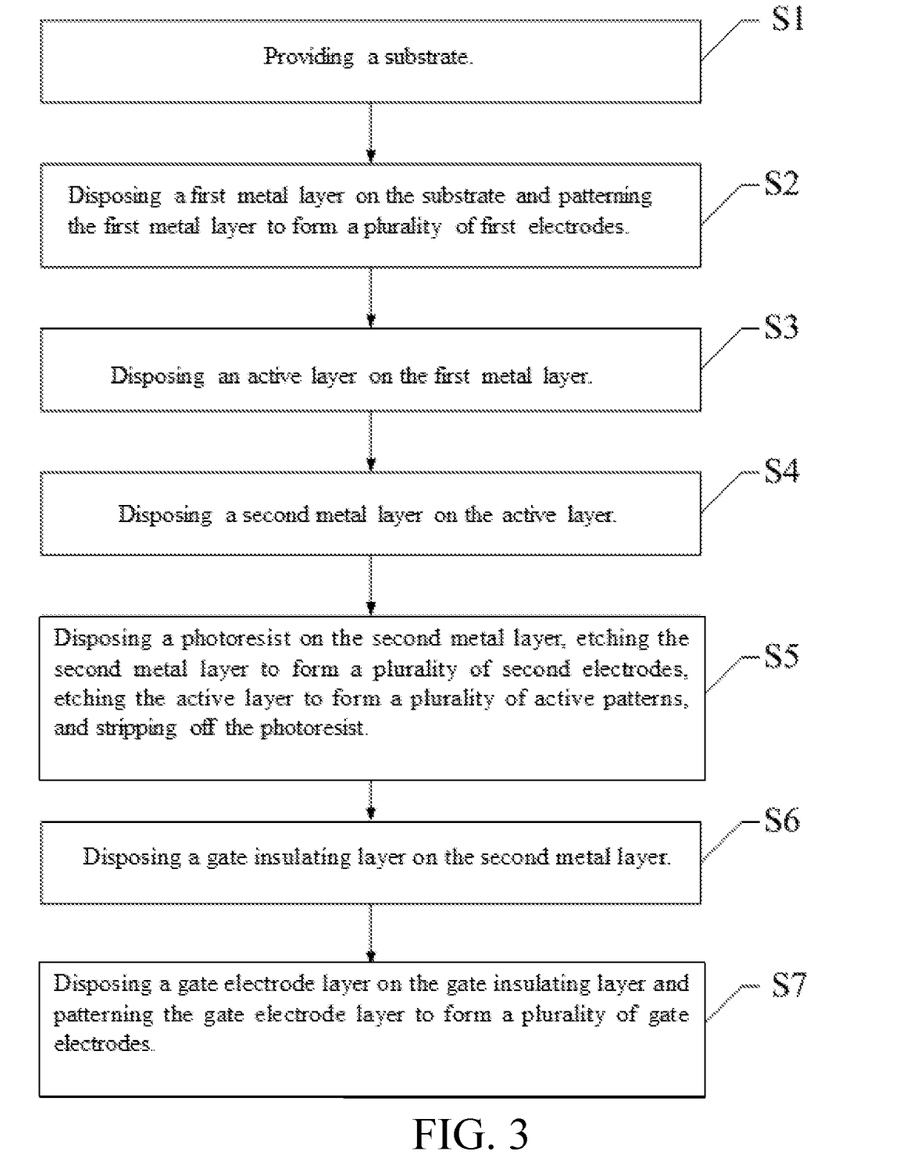
FIG. 3 is a flowchart of a manufacturing method of the array substrate according to an embodiment of the present disclosure.

As shown in FIG. 3, an embodiment of the present disclosure provides the manufacturing method of the array substrate. The method includes following steps.

Figure 4:
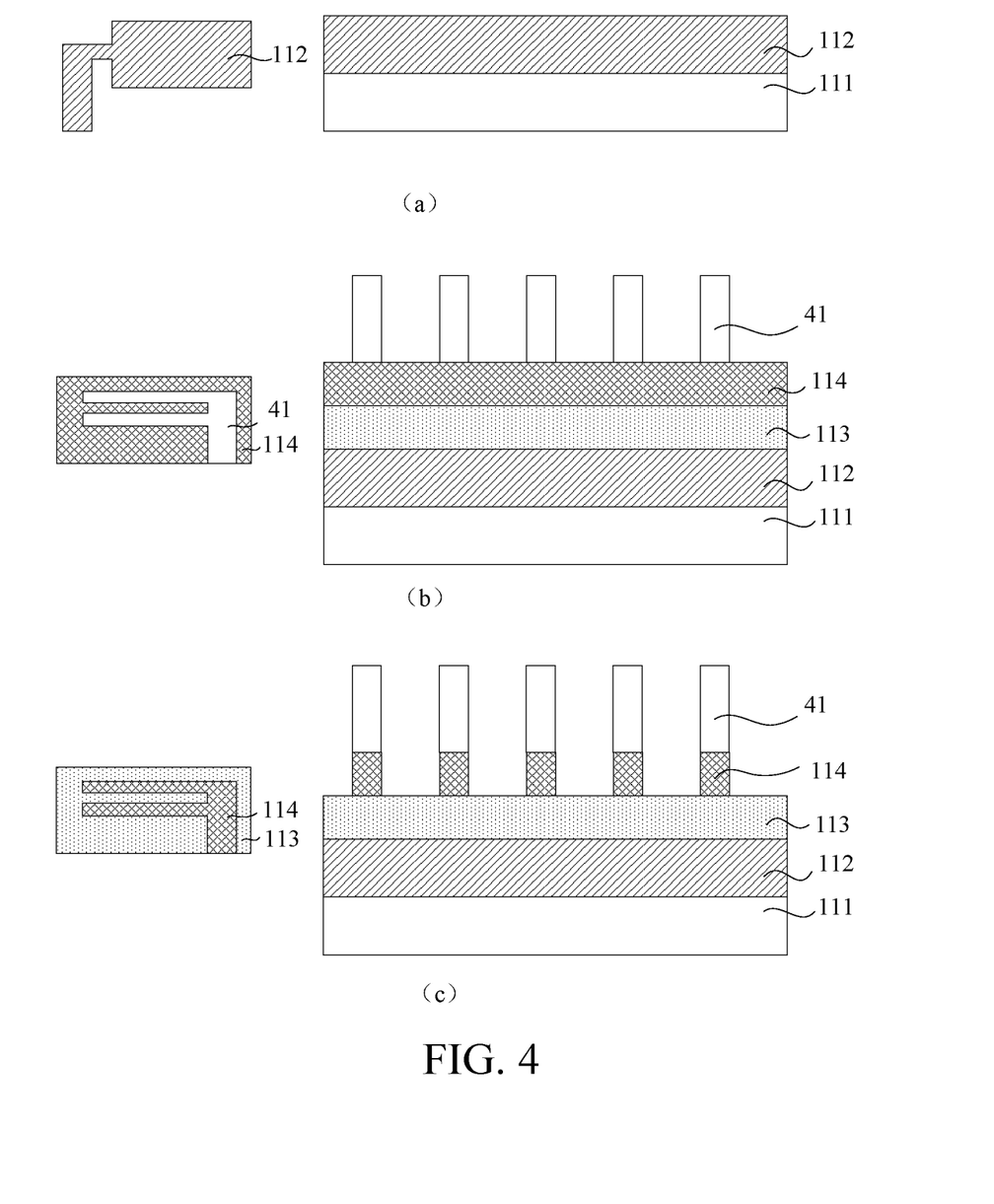
FIG. 4 is a first schematic structural diagram of the array substrate corresponding to each step of the manufacturing method of the array substrate according to an embodiment of the present disclosure.

S1: Providing the substrate. A structure of the array substrate is shown in FIG. 4(a).

S2: Disposing the first metal layer on the substrate and patterning the first metal layer to form the plurality of first electrodes. The structure of the array substrate is shown in FIG. 4(a), and a left picture in FIG. 4(a) is a top view of the one of the first electrodes.

S3: Disposing the active layer on the first metal layer. The structure of the array substrate is shown in FIG. 4(b).

S4: Disposing the second metal layer on the active layer. The structure of the array substrate is shown in FIG. 4(b).

S5: Disposing a photoresist on the second metal layer, etching the second metal layer to form the plurality of second electrodes, etching the active layer to form the plurality of active patterns, and stripping off the photoresist. Wherein, each of the second electrodes includes the plurality of second sub-electrodes, each of the active patterns includes the plurality of sub-active patterns, and the projection of the first electrodes on the active layer coincides with the projection of the second electrodes on the active layer.

S6: Disposing the gate insulating layer on the second metal layer. The structure of the array substrate is shown in FIG. 6(a).

S7: Disposing the gate electrode layer on the gate insulating layer and patterning the gate electrode layer to form the plurality of gate electrodes. Wherein, each of the gate electrodes has the part disposed among the sub-active patterns, and the gate electrodes are insulated from the active layer. The structure of the array substrate is shown in FIG. 6(b), and a left picture in FIG. 6(b) is a schematic perspective view of the one of the first electrodes, the one of the second electrodes, and the one of the gate electrodes.

This embodiment provides the manufacturing method of the array substrate. By disposing the first electrodes and the second electrodes on the top and bottom sides of the active layer, respectively, and disposing the part of each of the gate electrodes among the sub-active patterns, the array substrate manufactured by the method is formed with the vertical-structured thin film transistors. The channel length of the active layer, that is the thickness of the active layer, is much less than the channel length of the horizontal-structured active layer, so the channel resistance can be reduced; and since the first electrodes and the second electrodes have the overlapping portion in the vertical direction, the channel width of thin film transistors can be reduced, thereby reducing the area of the thin film transistors, reducing the impedance of the thin film transistors, and reducing the power consumption of the display panel.

Figure 5:
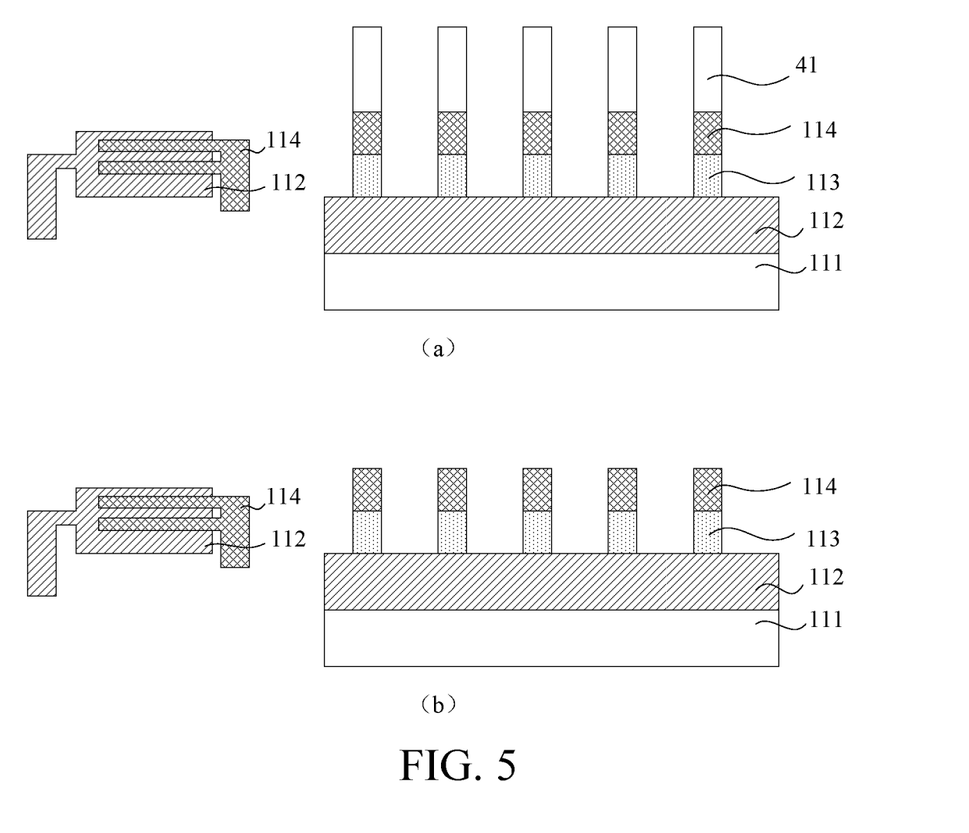
FIG. 5 is a second schematic structural diagram of the array substrate corresponding to each step of the manufacturing method of the array substrate according to an embodiment of the present disclosure.

It should be noted that in FIGS. 4 to 6, left pictures thereof are top views or perspective views of each film layer of the array substrate, and right pictures are cross-sectional views of each film layer of the array substrate.

In an embodiment, in the step of disposing the photoresist on the second metal layer, etching the second metal layer to form the plurality of second electrodes, etching the active layer to form the plurality of active patterns, stripping off the photoresist, and each of the second electrodes including the plurality of second sub-electrodes, and each of the active patterns including the plurality of sub-active patterns, the photoresist 41 is disposed on the second metal layer 114, in which the structure of the array substrate is shown in FIG. 4(b), then the second metal layer 114 is etched to form the second electrodes, in which the structure of the array substrate is shown in FIG. 4(c), then the active layer 113 is etched to form the active patterns, in which the structure of the array substrate is shown in FIG. 5(a), and then the photoresist is stripped off, in which the structure of the array substrate is shown in FIG. 5(b).

The manufacturing method of the array substrate provided in this embodiment reduces a number of masks, thereby simplifying a process and improving a manufacturing efficiency of the array substrate.

Figure 7:
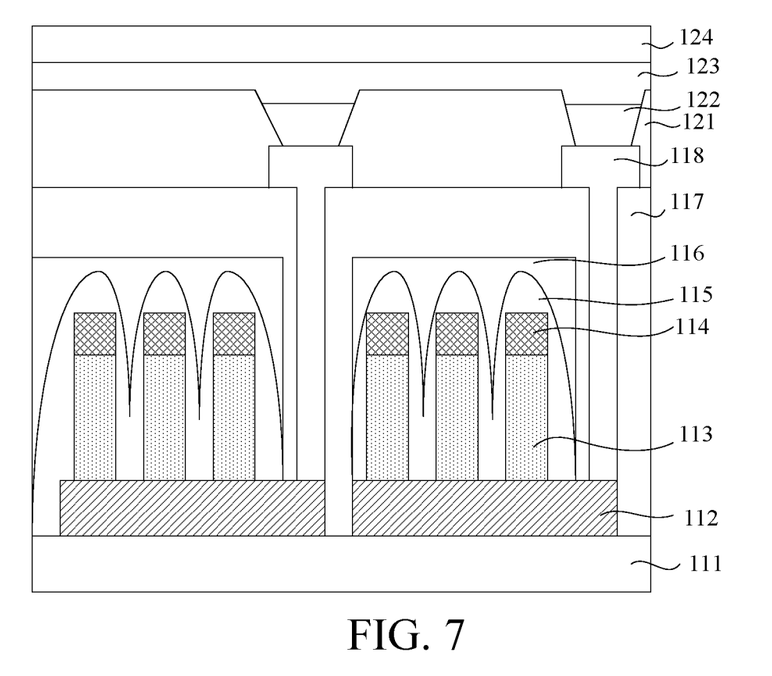
FIG. 7 is a schematic structural diagram of a display panel according to an embodiment of the present disclosure.

At a same time, as shown in FIG. 7, an embodiment of the present disclosure provides the display panel, which includes:

the substrate 111;

the first metal layer 112 disposed on the side of the substrate 111 and formed with the plurality of first electrodes;

the active layer 113 disposed on the side of the first metal layer 112 away from the substrate 111 and formed with the plurality of active patterns, and each of the active patterns has the plurality of sub-active patterns;

the second metal layer 114 disposed on the side of the active layer 113 away from the first metal layer 112 and formed with the plurality of second electrodes;

the gate insulating layer 115 disposed on the side of the second metal layer 114 away from the active layer 113;

the gate electrode layer 116 disposed on the side of the gate insulating layer 115 away from the second metal layer 114;

the passivation layer 117 disposed on one side of the gate electrode layer 116 away from the gate insulating layer;

the pixel electrode layer 118 disposed on the side of the passivation layer 117 away from the gate electrode layer 116;

a pixel definition layer 121 disposed on one side of the pixel electrode layer 118 away from the passivation layer 117;

a light-emitting layer 122 disposed on one side of the pixel definition layer 121 away from the pixel electrode layer 118;

a common electrode layer 123 disposed on one side of the light-emitting layer 122 away from the pixel electrode layer 118; and an encapsulation layer 124 disposed on one side of the common electrode layer 123 away from the light-emitting layer 122.

Wherein, the first electrodes are connected to the active layer 113, the second electrodes are connected to the active layer 113, and the projection of the first electrodes on the active layer and the projection of the second electrodes on the active layer have the overlapping portion. The array substrate 11 further includes the plurality of gate electrodes 116, each of the gate electrodes 116 has the part disposed among the sub-active patterns, and the gate electrodes are insulated from the active layer.

This embodiment provides the display panel. By disposing the first electrodes and the second electrodes on the top and bottom sides of the active layer, respectively, and disposing the part of each of the gate electrodes among the sub-active patterns, the display panel is formed with vertical-structured thin film transistors. The channel length of the active layer, that is the thickness of the active layer, is much less than the channel length of the horizontal-structured active layer, so the channel resistance can be reduced; and since the first electrodes and the second electrodes have the overlapping portion in the vertical direction, the channel width of thin film transistors can be reduced, thereby reducing the area of the thin film transistors, reducing the impedance of the thin film transistors, and reducing the power consumption of the display panel.

In an embodiment, the display panel includes an organic light-emitting diode (OLED) display panel.

In an embodiment, the display panel includes a liquid crystal display panel. Correspondingly, the liquid crystal display panel includes the array substrate provided in the embodiments of the present disclosure, a color filter substrate disposed opposite to the array substrate, and a liquid crystal layer disposed between the array substrate and the color filter substrate.

In an embodiment, in the display panel, the second metal layer is formed with the second electrodes, at least one of the second electrodes includes the plurality of second sub-electrodes, the second sub-electrodes are connected to each other to form the one of the second electrodes by the connecting ends of the second sub-electrodes, and the second sub-electrodes are in contact with the sub-active patterns correspondingly by one to one.

In an embodiment, in the display panel, the array substrate further includes the gate insulating layer disposed on the side of the second metal layer away from the active layer, the gate insulating layer is filled between the second sub-electrodes, and the gate insulating layer is filled between the sub-active patterns.

In an embodiment, in the display panel, the array substrate further includes the gate electrode layer disposed on the side of the gate insulating layer away from the second metal layer, the gate electrode layer includes the gate electrodes, and the part of each of the gate electrodes is filled between the gate insulating layer.

In an embodiment, in the display panel, the projected area of the first electrodes on the substrate is greater than the projected area of the second electrodes on the substrate.

In an embodiment, in the display panel, the array substrate further includes:

the passivation layer disposed on the side of the second metal layer away from the active layer and formed with the through-holes; and the pixel electrode layer disposed on the side of the passivation layer away from the second metal layer;

wherein, the pixel electrode layer penetrates through the through-holes to connect to the first electrodes.

In an embodiment, in the display panel, the array substrate further includes the gate electrode layer disposed on the side of the first metal layer away from the active layer.

In an embodiment, in the display panel, the first metal layer is formed with the first electrodes, at least one of the first electrodes includes the plurality of first sub-electrodes, and the first sub-electrodes are connected to each other to form the one of the first electrodes by the connecting ends of the first sub-electrodes.

In an embodiment, in the display panel, the first metal layer is formed with the light-shielding patterns, and the light-shielding patterns are insulated from the first electrodes.

It can be known according to the above embodiments:

The embodiments of the present disclosure provide the array substrate, the manufacturing method thereof, and the display panel. The array substrate includes the substrate, the first metal layer, the active layer, and the second metal layer. The first metal layer is disposed on the side of the substrate and is formed with the plurality of first electrodes. The active layer is disposed on the side of the first metal layer away from the substrate and is formed with the plurality of active patterns, wherein, each of the active patterns has the plurality of sub-active patterns. The second metal layer is disposed on the side of the active layer away from the first metal layer and is formed with the plurality of second electrodes. Wherein, the first electrodes are connected to the active layer, the second electrodes are connected to the active layer, and the projection of the first electrodes on the active layer and the projection of the second electrodes on the active layer have the overlapping portion. The array substrate further includes the plurality of gate electrodes, each of the gate electrodes has the part disposed among the sub-active patterns, and the gate electrodes are insulated from the active layer. By disposing the first electrodes and the second electrodes on the top and bottom sides of the active layer, respectively, and disposing the part of each of the gate electrodes among the sub-active patterns, the array substrate of the present disclosure is formed with the vertical-structured thin film transistors. The channel length of the active layer, that is the thickness of the active layer, is much less than the channel length of the horizontal-structured active layer, so the channel resistance can be reduced; and since the first electrodes and the second electrodes have the overlapping portion in the vertical direction, the channel width of thin film transistors can be reduced, thereby reducing the area of the thin film transistors, reducing the impedance of the thin film transistors, and reducing the power consumption of the display panel.

In the above embodiments, the description of each embodiment has its own emphasis. For the parts that are not described in detail in an embodiment, can refer to the detailed description of other embodiments above.

The array substrate, the manufacturing method thereof, and the display panel provided by the embodiments of the present disclosure are described in detail above. The specific examples are applied in the description to explain the principle and implementation of the disclosure. The description of the above embodiments is only for helping to understand the technical solution of the present disclosure and its core ideas, and it is understood that many changes and modifications to the described embodiment can be carried out without departing from the scope and the spirit of the disclosure that is intended to be limited only by the appended claims.

What is claimed is:

1. An array substrate, comprising:
    a substrate;
    a first metal layer disposed on one side of the substrate and formed with a plurality of first electrodes, the first metal layer being formed with light-shielding patterns, and the light-shielding patterns being insulated from the first electrodes;
    an active layer disposed on one side of the first metal layer away from the substrate and formed with a plurality of active patterns, wherein each of the active patterns has a plurality of sub-active patterns; and
    a second metal layer disposed on one side of the active layer away from the first metal layer and formed with a plurality of second electrodes;
    wherein the first electrodes are connected to the active layer, the second electrodes are connected to the active layer, and a projection of the first electrodes on the active layer and a projection of the second electrodes on the active layer have an overlapping portion; and
    the array substrate further comprises a plurality of gate electrodes, each of the gate electrodes has a part disposed among the sub-active patterns, and the gate electrodes are insulated from the active layer.

2. The array substrate according to claim 1, wherein the second metal layer is formed with the second electrodes, at least one of the second electrodes comprises a plurality of sub-electrodes, the sub-electrodes are connected to each other to form one of the second electrodes by connecting ends of the sub-electrodes, and the sub-electrodes are in contact with the sub-active patterns correspondingly by one to one.

3. The array substrate according to claim 2, further comprising a gate insulating layer disposed on one side of the second metal layer away from the active layer, wherein the gate insulating layer is filled between the sub-electrodes, and the gate insulating layer is filled between the sub-active patterns.

4. The array substrate according to claim 3, further comprising a gate electrode layer disposed on one side of the gate insulating layer away from the second metal layer, wherein the gate electrode layer comprises the gate electrodes, and the part of each of the gate electrodes is filled between the gate insulating layer.

5. The array substrate according to claim 2, wherein a projected area of the first electrodes on the substrate is greater than a projected area of the second electrodes on the substrate.

6. The array substrate according to claim 5, further comprising:
    a passivation layer disposed on one side of the second metal layer away from the active layer and formed with through-holes; and
    a pixel electrode layer disposed on one side of the passivation layer away from the second metal layer;
    wherein the pixel electrode layer penetrates through the through-holes to connect to the first electrodes.

7. The array substrate according to claim 1, further comprising a gate electrode layer disposed on one side of the first metal layer away from the active layer.

8. The array substrate according to claim 1, wherein the first metal layer is formed with the first electrodes, at least one of the first electrodes comprises a plurality of first sub-electrodes, and the first sub-electrodes are connected to each other to form one of the first electrodes by connecting ends of the first sub-electrodes.

9. The array substrate according to claim 1, wherein a projected area of the second electrodes on the substrate is greater than a projected area of the first electrodes on the substrate.

10. A manufacturing method of an array substrate, comprising following steps:
    providing a substrate;
    disposing a first metal layer on the substrate and patterning the first metal layer to form a plurality of first electrodes, providing the first metal layer with light-shielding patterns, the light-shielding patterns being insulated from the first electrodes;
    disposing an active layer on the first metal layer;
    disposing a second metal layer on the active layer;
    disposing a photoresist on the second metal layer, etching the second metal layer to form a plurality of second electrodes, etching the active layer to form a plurality of active patterns, and stripping off the photoresist; wherein each of the second electrodes comprises a plurality of sub-electrodes, each of the active patterns comprises a plurality of sub-active patterns, and a projection of the first electrodes on the active layer coincides with a projection of the second electrodes on the active layer;
    disposing a gate insulating layer on the second metal layer; and
    disposing a gate electrode layer on the gate insulating layer and patterning the gate electrode layer to form a plurality of gate electrodes, wherein each of the gate electrodes has a part disposed among the sub-active patterns, and the gate electrodes are insulated from the active layer.

11. A display panel, comprising an array substrate, wherein the array substrate comprises:
    a substrate;

a first metal layer disposed on one side of the substrate and formed with a plurality of first electrodes, the first metal layer being formed with light-shielding patterns, and the light-shielding patterns being insulated from the first electrodes;

an active layer disposed on one side of the first metal layer away from the substrate and formed with a plurality of active patterns, wherein each of the active patterns has a plurality of sub-active patterns; and a second metal layer disposed on one side of the active layer away from the first metal layer and formed with a plurality of second electrodes;

wherein the first electrodes are connected to the active layer, the second electrodes are connected to the active layer, and a projection of the first electrodes on the active layer and a projection of the second electrodes on the active layer have an overlapping portion; and the array substrate further comprises a plurality of gate electrodes, each of the gate electrodes has a part disposed among the sub-active patterns, and the gate electrodes are insulated from the active layer.

12. The display panel according to claim 11, wherein the second metal layer is formed with the second electrodes, at least one of the second electrodes comprises a plurality of sub-electrodes, the sub-electrodes are connected to each other to form one of the second electrodes by connecting ends of the sub-electrodes, and the sub-electrodes are in contact with the sub-active patterns correspondingly by one to one.

13. The display panel according to claim 12, wherein the array substrate further comprises a gate insulating layer disposed on one side of the second metal layer away from the active layer, the gate insulating layer is filled between the sub-electrodes, and the gate insulating layer is filled between the sub-active patterns.

14. The display panel according to claim 13, wherein the array substrate further comprises a gate electrode layer disposed on one side of the gate insulating layer away from the second metal layer, the gate electrode layer comprises the gate electrodes, and the part of each of the gate electrodes is filled between the gate insulating layer.

15. The display panel according to claim 12, wherein a projected area of the first electrodes on the substrate is greater than a projected area of the second electrodes on the substrate.

16. The display panel according to claim 15, wherein the array substrate further comprises:

a passivation layer disposed on one side of the second metal layer away from the active layer and formed with through-holes; and a pixel electrode layer disposed on one side of the passivation layer away from the second metal layer;

wherein the pixel electrode layer penetrates through the through-holes to connect to the first electrodes.

17. The display panel according to claim 11, wherein the array substrate further comprises a gate electrode layer disposed on one side of the first metal layer away from the active layer.

18. The display panel according to claim 11, wherein the first metal layer is formed with the first electrodes, at least one of the first electrodes comprises a plurality of first sub-electrodes, and the first sub-electrodes are connected to each other to form one of the first electrodes by connecting ends of the first sub-electrodes.

* * * * *